(12) United States Patent
Hartley (10) Patent No.: US 6,749,320 B1
(45) Date of Patent: Jun. 15, 2004

(54) LAMP FOR A FLASHLIGHT

(76) Inventor: Fred Jack Hartley, 14641 Fair Havens Rd., Fort Meyers, FL (US) 33908

( * ) Notice: Subject to any disclaimer, the term of this patent is extended or adjusted under 35 U.S.C. 154(b) by 18 days.

(21) Appl. No.: 10/292,227

(22) Filed: Nov. 12, 2002

Related U.S. Application Data (63) Continuation-in-part of application No. 09/785,363, filed on Feb. 16, 2001, now Pat. No. 6,190,020, which is a continuation-in-part of application No. 09/338,625, filed on Jun. 23, 1999.

(51) Int. Cl.[7] ............................................... F21V 33/00
(52) U.S. Cl. ....................... 362/184; 362/206; 362/186; 362/800
(58) Field of Search ................................ 362/184, 800, 362/555, 206, 186, 558, 173, 191, 194, 195, 201

(56) References Cited

U.S. PATENT DOCUMENTS

| | | | | |
|---|---|---|---|---|
| 5,580,156 A | * | 12/1996 | Suzuki et al. ............... | 362/184 |
| 5,924,784 A | * | 7/1999 | Chliwnyj et al. ............ | 362/234 |
| 6,086,218 A | * | 7/2000 | Robertson .................... | 362/157 |
| 6,095,661 A | * | 8/2000 | Lebens et al. ............... | 362/184 |
| 6,485,160 B1 | * | 11/2002 | Sommers et al. ............ | 362/184 |

* cited by examiner

*Primary Examiner*—Sandra O'Shea
*Assistant Examiner*—Guiyoung Lee (57) ABSTRACT

Proper placement of a lighted area produced by light from a light emitting diode chip relative to a base provides for a lamp for use with conventional flashlights having a collimating reflector. At least a portion of the light produced by the light emitting diode chip then is collimated into a beam of light for projection from the flashlight. Various means are disclosed to provide for a radial distribution of the produced light wherein the produced light properly strikes the collimating reflector for concentration into the beam of light. Lens elements, scarification of an exterior surface and placement of reflective surfaces are all disclosed as examples of methods to provide for the desired distribution of light. Such methods may be used singularly or in various combinations.

19 Claims, 8 Drawing Sheets

LAMP FOR A FLASHLIGHT

CROSS-REFERENCES

This application is a continuation-in-part of Ser. No.: 09/785,363, filed Feb. 16, 2001, entitled "Light Emitting Diode Assembly for Flashlights", currently pending, which is a part of U.S. Pat. No. : 6,190,020, issued Feb. 20, 2001, Ser. No.: 09/338,625, filed Jun. 23, 1999, entitled "Light Producing Assembly for a Flashlight". These applications are incorporated herein by this reference.

BACKGROUND

1. Field of the Invention

Generally, the invention relates to lamps for flashlights. More specifically, the invention relates to such lamps which utilize a light emitting diode chip to produce light which is subsequently collimated into a beam of light for projection from the flashlight.

2. Description of the Prior Art

It is estimated that in 1998 over two hundred (200) million collimating reflector type flashlights were produced. Conventionally known flashlights which utilize a collimating reflector operate with incandescent lamps (bulbs) which have a filament placed in a geometric position compatible with the focal point of the collimating reflector.

Incandescent lamps are constructed with a 'light center length' or LCL which is defined as the best strait line that can be passed through the majority of the lighted coil. A collimated beam of light, defined by 'beam candle power', is created when the coil is properly positioned to the focal point of the collimating reflector.

As a source of illumination, conventional light emitting diode chips are generally limited to small flashlights such as key chain type lights, small pen lights and small flashlights which do not utilize collimating reflectors to enhance the collimation of the produced light. This is due primarily to the narrow view angle of the produced light and the lack of utilization of light bending surfaces or other diffusion or dispersion methods. Attempts have been made to use light emitting diode chips in incandescent lamp bases. These attempts generally have been limited to providing a convenient light source for use in existing flashlights where the produced light does not interact with the collimating reflector of those flashlights. It is important to note that these replacement incandescent lamps using light emitting diode chips were not designed to operate with the collimating reflector to produce a beam of light prior to applicant's invention.

Conventional, narrow projection angle, light emitting diode chip light sources lack light bending surfaces to broaden the narrow view angle of the produced light. The light emitting diode chip, in conventional form, does not make a satisfactory source of light for conventional flashlights because the point source of light is on a plane. The conventional light emitting diode chip is formed by the deposition of semiconductor materials and phosphors to a substrate in a planar configuration which inhibits use as a broad spectrum light source. Conventional collimating reflector flashlight require the broad spectrum light source.

The Polar light distribution of conventional light emitting diode chips is at best about one hundred and twenty-five (125) degrees and most commonly about fifteen (15) degrees. Conventional collimating reflector flashlights require a polar distribution of three hundred and sixty (360) degrees, (radially), for maximum efficiency.

Some progress has recently been made to provide for a widening of the projection angle of light emitting diode chips. A principle method of widening the projection angle of light emitting diode chips involves placement of the light emitting diode chip within a tiny cup or bowl reflector base. Work in this area has resulted in widening the projection angle from the common fifteen (15) degrees to as much as one hundred and twenty (120) degrees and slightly beyond. Typically phosphor, or another suitable material, is used as a coating over the light emitting diode chip which then acts to diffuse the light produced by the light emitting diode chip to enable the tiny reflector base to widen the projection angle. These new style light emitting diode chips are ideally suited for use with the present invention. Both the conventional light emitting diode chips and the new style coated light emitting diode chips use an acrylic or plastic molded lens.

Various methods exist in the art to alter the angle of projection of light. Such conventional methods to alter the angle of projection of light include lighted panels and annunciators, amongst others. Your applicant is unaware of utilization of such methods, prior to applicant's invention, with light emitting diode chip light sources wherein the produced light may be efficiently used with flashlights having a conventional collimating reflector where the produced light reaches the inner wall of a collimating reflector to be collimated into a beam of light.

Light emitting diode chips which produce white light, offer a new and superior light source for collimating reflector type flashlights in that they provide superior lamp life and battery run time. Conventional light emitting diode chip light sources are unsatisfactory for direct use in flashlights with collimating reflectors due to a narrow viewing angle of the light emitting diode chip, generally between fifteen (15) degrees and thirty (30) degrees. When the conventional light emitting diode chip is positioned facing away from the collimating reflector, this narrow viewing angle projects the available light beyond the walls of the collimating reflector. When the conventional light emitting diode chip is positioned facing toward the collimating reflector, this narrow viewing angle projects the available light to only a portion of the wall of the collimating reflector. The curved collimating reflector wall therefore cannot properly act upon the produced light of conventional light emitting diode chip light sources to collimated the light beam. The new style light emitting diode chips which produce wider projection angles suffer similar deficiencies to those experienced by conventional light emitting diode chips.

For the above mentioned reasons, mere substitution of a light emitting diode chip light source for the conventional incandescent lamp in flashlights, where the flashlight has a curved collimating reflector, will fail because the substitute light emitting diode chip light source and the existing curved collimating reflector will fail to cooperate to produce an acceptable collimated beam of light.

Lamps based upon light emitting diode chips are superior to conventional lamps based upon incandescent filaments because they: 1) require less power, 2) have a longer life, 3) have a greater resistance to both shock and vibration and 4) provide generally higher color temperature.

Due to the long life of the light emitting diode chip it is conceivable that a flashlight having a light emitting diode chip as the light source would never require replacement of the light source. Due to the lower power requirement of the light emitting diode chip, batteries of such flashlights would last up to 10 times as long as batteries of conventional incandescent flashlights. This combination provides for considerable cost and environmental savings.

Efforts have been made to provide for a flashlight having a suitably narrow projection beam of light which utilize light emitting diode chips as the light source. These efforts avoid use of a collimating reflector and rely upon projection of the light from the light emitting diode chip directly onto an optical focusing lens which then projects the light passing therethrough into the narrow projection beam of light. Such flashlights, while producing an acceptable beam of light, are extremely expensive to manufacture when compared to collimating reflector type flashlights due to the expense involved with manufacture of the optical focusing lens. For this reason such flashlights are not considered applicable to the present invention.

The present invention has direct positive environmental impact by significantly reducing the number of batteries consumed by the public. As an example, conventional krypton pre-focused lamps for a collimating reflector type flashlight draws between about seven tenths (0.7) amps to two (2.0) amps. Light emitting diode chips applicable to the present invention may draws as little as about two hundredths (0.02) amps up to about seven tenths (0.7) amps while producing comparable lumens. This substantial power draw difference will result in flashlight batteries lasting substantially longer, which means less batteries required over a period of time, which means less batteries being disposed of in land fill areas.

A great need exists for a lamp for collimating reflector type flashlights where the lamp has low current draw, long life and which are inexpensive to manufacture. Numerous attempts have been made to produce collimating reflector type flashlights, and the corresponding lamps, which have the desired low current draw, long life and low manufacturing costs. These attempts have been less efficient than desired. The present invention substantially fulfills these needs. Utilization of the designs of the present invention will fill a long felt need and create a new market niche.

SUMMARY

In view of the foregoing disadvantages inherent in the known types of lamps for flashlights, your applicant has devised a type of lamp for installation in a flashlight which will be vastly superior to current use lamps. The flashlight with which applicant's lamps will operate will have a collimating reflector capable of having a lamp positioned thereabout where light produced by the lamp may interact with the collimating reflector to be collimated into a beam of light for projection from the flashlight. The collimating reflector will have a cavity, an aperture, a central axis, a focal point and a reflector registering plane. The aperture is positioned at a symmetrically located position at one end of the cavity. The central axis extends through a central point of the aperture and extends through the cavity such that the cavity is symmetrically positioned about the central axis. The focal point is situated within the cavity at a predetermined spacing from the reflector registering plane and on the central axis. The focal point is the position where light radiating therefrom will be collimated by the collimating reflector into the beam of light. The lamp will have a base and a light emitting diode chip emitter positioned relative to the base. The base has a center axis extending therethrough and has a lamp registering plane positioned wherein the center axis of the base perpendicularly intersects the lamp registering plane. The base is positioned relative to the aperture of the collimating reflector of the flashlight during the installation of the lamp in the flashlight with the center axis of the base aligned with the central axis of the collimating reflector following the installation. The light emitting diode emitter has a light emitting diode chip which produces light. The light emitting diode emitter also has distribution means to provide for a radial distribution of at least a portion of the light produced by the light emitting diode emitter radially outward. The distribution means producing a lighted area having an average center of radiation when the light emitting diode emitter is producing light. Placement means provides for a placement of the average center of radiation of the lighted area of the light emitting diode emitter relative to the base at a relative spacing from the lamp registering plane of the base and on the center axis of the base.

My invention resides not in any one of these features per se, but rather in the particular combinations of them herein disclosed and it is distinguished from the prior art in these particular combinations of these structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore a primary object of the present invention to provide for a lamp, which relies upon a light emitting diode chip to produce light, for subsequent placement in a flashlight of the collimating reflector type.

Other objects include;
 a) to provide for a radial distribution of light produced by the light emitting diode chip wherein the light produced by the lamp may properly interact with a collimating reflector of the flashlight into which the lamp is installed.
 b) to provide for a placement of a lighted area of the lamp relative to a base of the lamp which matches a focal point of the collimating reflector of the flashlight following installation of the lamp in the flashlight.
 c) to provide for properties of refraction to provide, at least in part, for the radial dispersion of the produced light.
 d) to provide for properties of diffusion to provide, at least in part, for the radial dispersion of the produced light.
 e) to provide for properties of reflection to provide, at least in part, for the radial dispersion of the produced light.
 f) to provide for compound surface areas on a protective cover encasing the light emitting diode chip to provide for the properties of diffusion.
 g) to provide for surface coatings on a protective cover encasing the light emitting diode chip to provide for the properties of reflection.
 h) to provide for a scarification of an exterior surface of a protective cover encasing the light emitting diode chip to provide for the properties of diffusion.

i) to provide for a lamp having a base wherein an exterior of the base generally matches industry standard bases of conventional incandescent lamps as used for collimating reflector type flashlights.

j) to provide for the exterior of the base of the lamp to have a smooth surface generally matching industry standard smooth exterior bases of conventional incandescent lamps as used for collimating reflector type flashlights.

k) to provide for a filler material between the light emitting diode chip and a flange of the base to protect an integrity of the lamp and to maintain proper spacing of a lighted area of the lamp.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated the preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION

Many different lamps having features of the present invention are possible. The following description describes the preferred embodiment of select features of those lamps and various combinations thereof. These features may be deployed in various combinations to arrive at various desired working configurations of lamps.

Reference is hereafter made to the drawings where like reference numerals refer to like parts throughout the various views.

Lamp

A lamp having features of the present invention will be installed in a flashlight and will produce light. The lamp will have a base, a light emitting diode emitter positioned relative to the base and dispersion means to provide for a distribution of at least a portion of the light produced by the light emitting diode emitter radially outward.

FIG. 1, FIG. 6, FIG. 7 and FIG. 11 depict a lamp 30 having features of the present invention.

Flashlights

Flashlights applicable to the present invention will have a collimating reflector capable of having a lamp positioned thereabout where light produced by the lamp may interact with the collimating reflector to be collimated into a beam of light for projection from the flashlight. The collimating reflector preferably will have a cavity, an aperture, a central axis, a focal point and a reflector registering plane. The aperture is positioned at a symmetrically located position at one end of the cavity. The central axis extends through a central point of the aperture and extends through the cavity such that the cavity is symmetrically positioned about the central axis. The focal point is situated within the cavity at a predetermined spacing from the reflector registering plane and on the central axis. The focal point is the position where light radiating therefrom will be collimated by the collimating reflector into the beam of light.

Lamps having features of the present invention may take the form of a replacement lamp capable of being installed into existing collimating reflector type flashlights or may take the form of a lamp for permanent installation into a collimating reflector type flashlight during manufacture of the flashlight.

Figure 1:
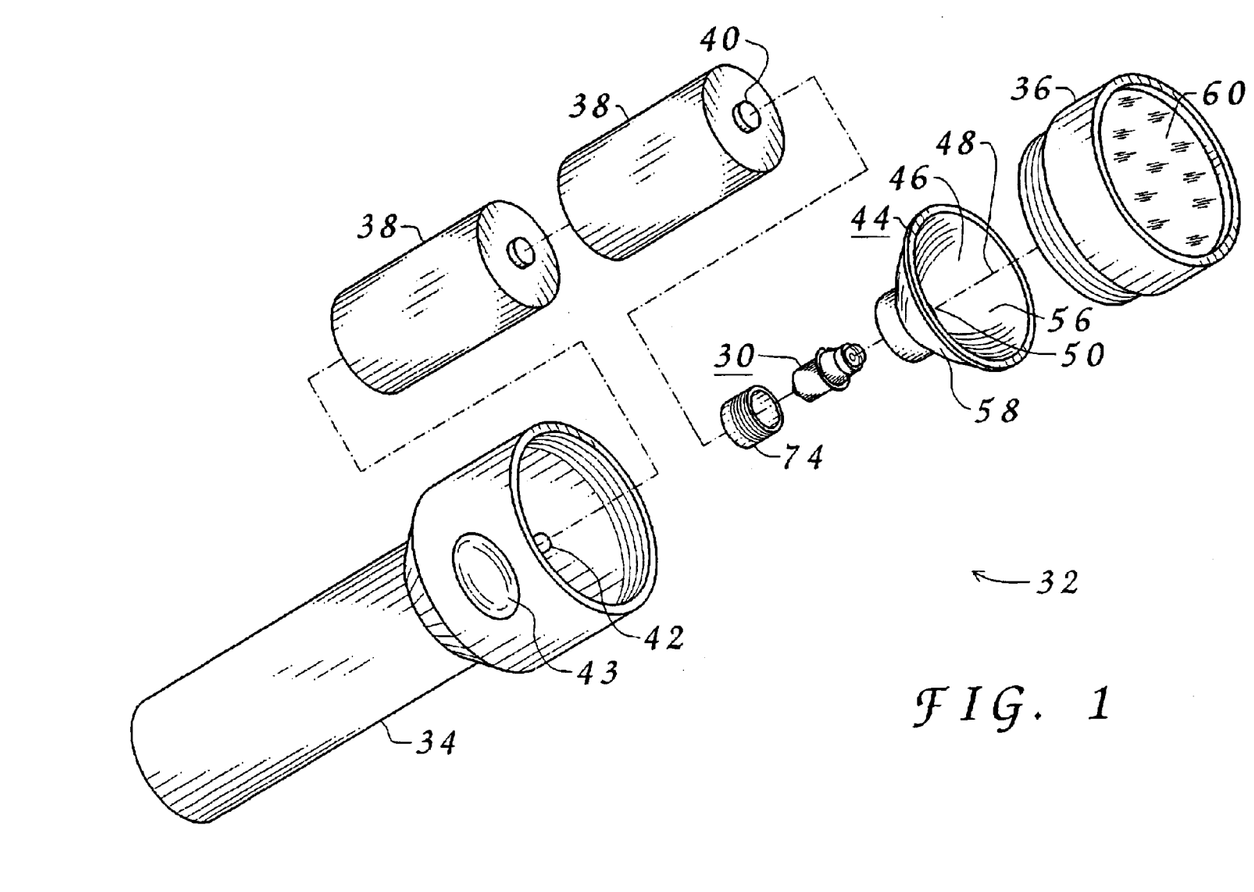
FIG. 1 is an exploded perspective view showing the positional orientation of various components of a conventional collimating reflector type flashlight including placement of a lamp having features of the present invention.

Numerous designs of collimating reflector type flashlights exist in the art. Many of these designs may be utilized with the present invention. FIG. 1 depicts one example of such a design wherein a flashlight 32 is shown having a body 34 and a head 36 which are mountable together. Body 34 houses a power supply in the form of batteries 38. Batteries 38 are mounted within body 34 and make contact at a lower extent with an electrical connector as conventionally known in the art, not shown. The outermost battery 38 then has a first power transfer connector 40 positioned thereon. The electrical connector which makes contact with the innermost battery 38 at the base of body 34 then extend upward to a second power transfer connector 42. A switch 43, having an active position, or 'on' setting, and an inactive position, or 'off' setting, provides for user manipulation of a power feed between first power transfer connector 40 and second power transfer connector 42 when other components, more fully disclosed below, provide contact between first power transfer connector 40 and second power transfer connector 42, as conventionally known in the art.

Figure 10:
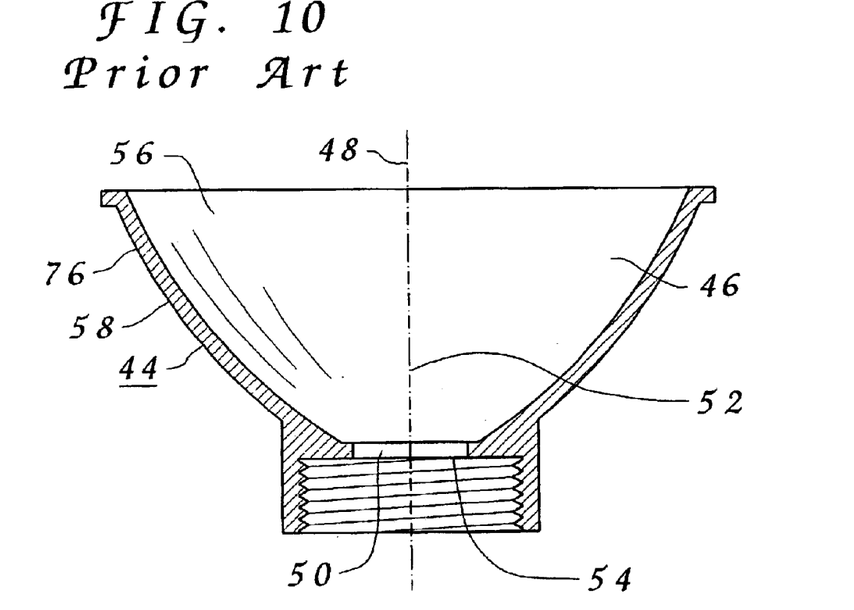
FIG. 10 is a sectional view of the collimating reflector shown in FIG. 1 and labeled as 'Prior Art'.
Figure 11:
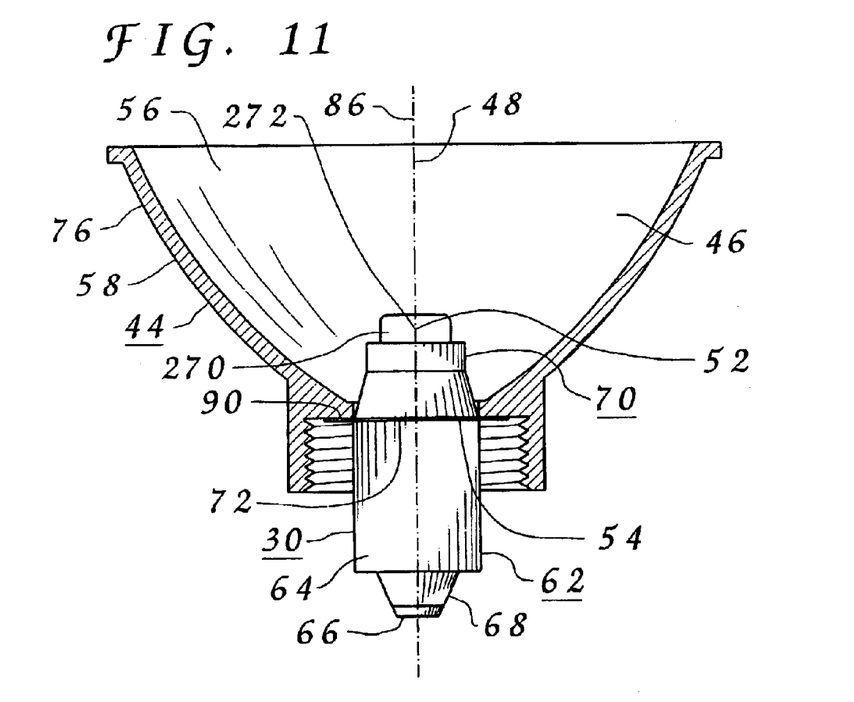
FIG. 11 is a sectional view of the collimating reflector shown in FIG. 10 with the lamp shown in FIG. 6 positioned therein.

Head 36 accepts positioning therein of a collimating reflector 44, also see FIG. 10 and FIG. 11. Collimating reflector 44 has a cavity 46, a central axis 48, an aperture 50, a focal point 52 and a reflector registering plane 54. Aperture 50 accepts installation therein of lamp 30, see FIG. 11. Collimating reflector 44 has a reflective surface 56 on one side and a conductive surface 58 on the opposing side. Reflective surface 56, which is polished to provide excellent reflective properties, generally defines cavity 46. Conductive surface 58 is capable of carrying an electrical transfer. Central axis 48 extends through a center point of aperture 50 and extends through cavity 46. Cavity 46 is symmetrically positioned about central axis 48. Focal point 52 is situated within cavity 46 at a predetermined spacing from reflector registering plane 54 and on central axis 48. Focal point 52 is a position from which produced light will interact with reflective surface 56 to be collimated into a beam of light. A lens cover 60 at the end of head 36 provides for protection of cavity 46 and that portion of lamp 30 positioned therein following assembly of flashlight 32. Lens cover 60 is transparent, as conventionally known in the art.

With reference now to FIG. 1, FIG. 6, FIG. 7 and FIG. 11, lamp 30, being typical of lamps of the present invention, has a base 62 having an exterior 64 and an interior, not shown in these view. Exterior 64 is capable of carrying an electrical transfer. A first electrical connector 66 is positioned at the end of base 62 and is surrounded, and insulated from, exterior 64 by an insulator 68. First electrical connector 66 is coupled through base 62 to provide power into the interior of base 62 for subsequent connection to a light emitting diode emitter 70.

Numerous designs are known in the art to provide for coupling means for a mounting of the lamp within the flashlight. A flange 72 extends outward radially from base 62. Flange 72 is capable of carrying an electrical transfer and is an extension of exterior 64 of base 62. Flange 72 allows lamp 30 to be inserted into aperture 50 with flange 72 in contact with collimating reflector 44, see FIG. 11. This arrangement provides for light emitting diode emitter 70 of lamp 30 to be positioned in cavity 46 of collimating reflector 44. A coupling member 74 is threaded for attachment to collimating reflector 44 while lamp 30 is positioned within aperture 50 to securely hold lamp 30 relative to collimating reflector 44. Therefore, flange 72, in cooperation with exterior 64 of base 62 and conductive surface 58 of collimating reflector 44, forms a second electrical connector 76. Second electrical connector 76 is coupled through base 62 to provide power into the interior of base 62 for subsequent connection to light emitting diode emitter 70.

When properly mounted, and when switch 43 is in the active position, first power transfer connector 40 of flashlight 32 may make contact with first electrical connector 66 of lamp 30 to transfer power therebetween. Similarly, second power transfer connector 42 of flashlight 32 may make contact with second electrical connector 76 for conductive communication with exterior 64 of base 62 of lamp 30 to transfer power therebetween. This arrangement allows power to be active or inactive, depending upon the status of switch 43, to components of lamp 30. Light emitting diode emitter 70 has a light emitting diode chip 78, see FIG. 7, which selectively receive power from first electrical connector 66 following a subsequent connection and second electrical connector 76 following a subsequent connection.

Figure 5:
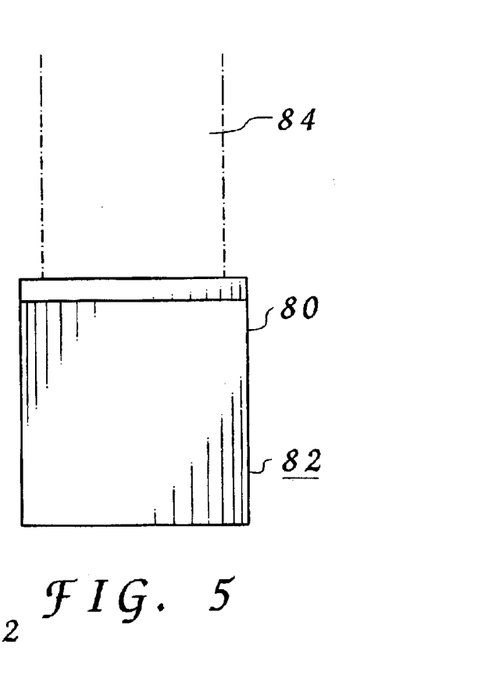
FIG. 5 is a plan view of a representation of the head of a flashlight with a depiction of a desired projection of a beam of light.

FIG. 5 depicts a head 80 of a flashlight 82. Flashlight 82 produces a beam of light 84 which extends outward from head 80 with little dispersion as is desired for such collimating reflector type flashlights and as may be produced by lamps having features of the present invention.

Base

Lamps having features of the present invention will have a base capable of being mounted within the flashlight. Any conventionally known base for use in collimating reflector type flashlights may be employed with the present invention. The base will having means to provide for a positioning of the base relative to the aperture of the collimating reflector of the flashlight during the installation in the flashlight. Preferably the base will have a flange which aligns with a lamp registering plane which will align with the reflector registering plane subsequent to installation of the lamp in the reflector of the flashlight.

Figure 16:
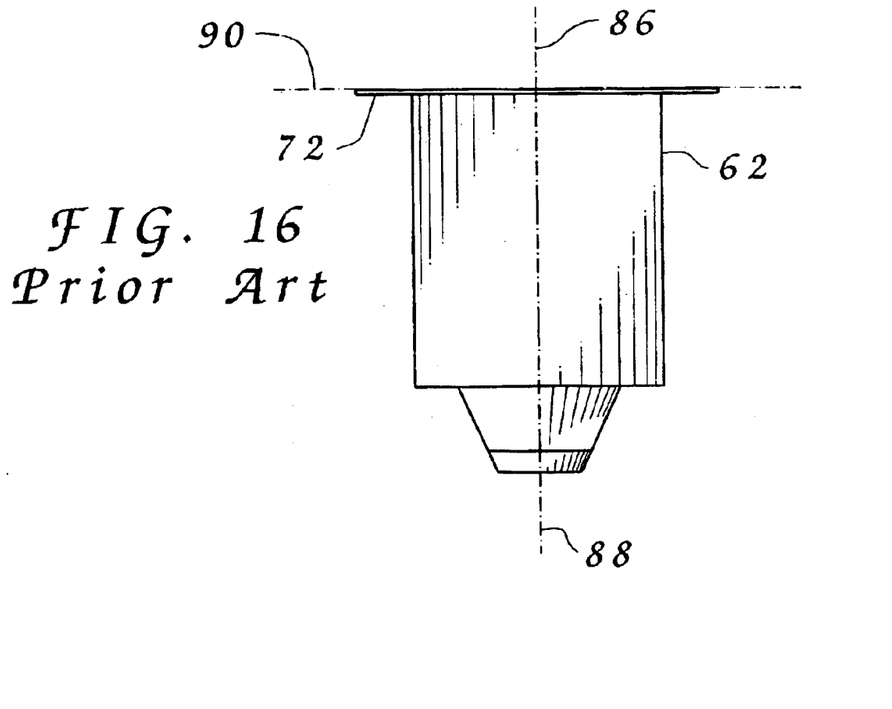
FIG. 16 is a plan view of a base of the lamp shown in FIG. 6 and labeled as 'Prior Art'.
Figure 17:
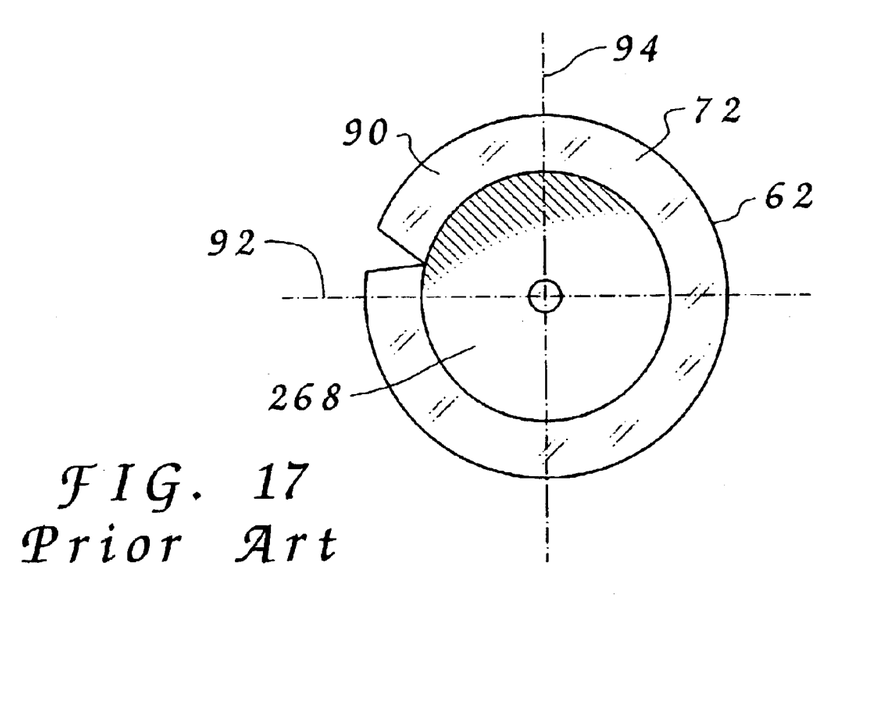
FIG. 17 is an elevational view of the base shown in FIG. 16 and labeled as 'Prior Art'.

FIG. 16 and FIG. 17 depict base 62 having a central axis 86 which is also a 'y' axis 88 of a three dimensional coordinate grid. Central axis 86 extends through base 62 and aligns with central axis 48 of collimating reflector 44, see FIG. 11, following installation of lamp 30 having base 62. Base 62 has flange 72 which defines a lamp registering plane 90. Central axis 86 perpendicularly intersects lamp registering plane 90. Following installation of lamp 30 into collimating reflector 44, see FIG. 11, lamp registering plane 90 and reflector registering plane 54 align and are in contact. Lamp registering plane 90 extends along a 'x' axis 92 and a 'z' axis 94 of the three dimensional coordinate grid. As previously described base 62 has the capacity to transfer power to electrical components installed about base 62 when installed within flashlight 32, see FIG. 1.

Light Source

Lamps having features of the present invention will have a light emitting diode chip capable of producing light as a light source. The light emitting diode chip may be of the standard narrow projection type, of the more modern wide field projection type, of the standard low power draw type or of the more modern high power draw type. The lamp may have a single light emitting diode chip or may have more than one light emitting diode chips. The term light emitting diode chip as used herein refers to the actual light producing element. The term light emitting diode emitter as used herein refers to the assembly including the light emitting diode chip, any necessary connecting wires or other electronics, any sealing package protecting the light emitting diode chip without regard for whether or not the sealing package has dispersion properties and any structures which provide for a radial distribution of a portion of produced light when those structures are attached to the lamp. The light emitting diode emitter will produce a lighted area having an average center of radiation when the light emitting diode emitter is producing light. The lighted area will be centered on the center axis of the base of the lamp and along the 'y' axis of the three dimensional coordinate grid. Preferably the lighted area will be symmetrically shaped about the center axis of the base of the lamp.

Ideally, the light produced by lamps having features of the present invention will be projected onto a large portion of the reflective surface of the collimating reflector of the flashlight into which it is installed. This desire may be accomplished based upon many unique embodiments of lamps. Without regard for the number of light emitting diode chips deployed, numerous directional orientations of initial projection are possible. When a single light emitting diode chip is deployed typically an initial path of projection of the produced light will align with an axis of projection of the collimated beam of light produced by the flashlight. This may be either initially outward from the collimating reflector when the lamp is mounted in the flashlight or inward toward the collimating reflector when the lamp is mounted in the flashlight. When a plurality of light emitting diode chips are deployed the paths of projection of the produced light from the separate light emitting diode chips may be parallel to each other or may have unique directional orientations.

The light emitting diode emitter will have a protective cover over the light emitting diode chip. Preferable this protective cover will have dispersion properties. This protective cover, with or without dispersion properties, may cover a single light emitting diode chip or multiple light emitting diode chips.

Figure 2:
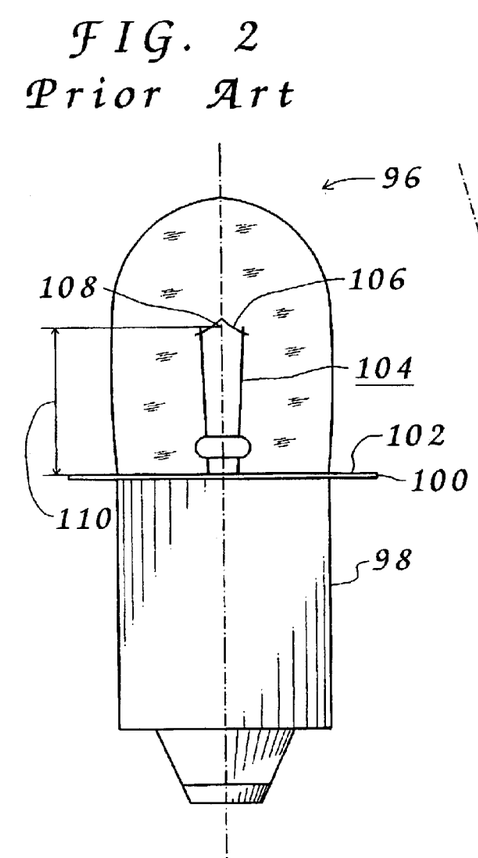
FIG. 2 is an elevational side view of a representation of a conventional incandescent lamp as used in collimating reflector type flashlights and labeled as 'Prior Art'.

Referring now to the state of the art, FIG. 2 depicts an example of a lamp 96, as conventionally known in the art, for use in collimating reflector type flashlights and generally comparable to the present invention. Lamp 96 has a base 98 having a flange 100 which defines a lamp registering plane 102. Lamp 96 has a light source 104 which has a filament 106 which produces light in response to a power flow passing therethrough. Filament 106 has an average center of radiation 108 which has a spacing 110 from lamp registering plane 102 where spacing 110 places average center of radiation 108 at a focal point of the collimating reflector when positioned within the collimating reflector type flashlight, not shown in this view. Preferably the lighted area produced by lamps having features of the present invention generally match placement of average center of radiation 108 of lamp 96 when mounted in such collimating reflector type flashlights.

Figure 3:
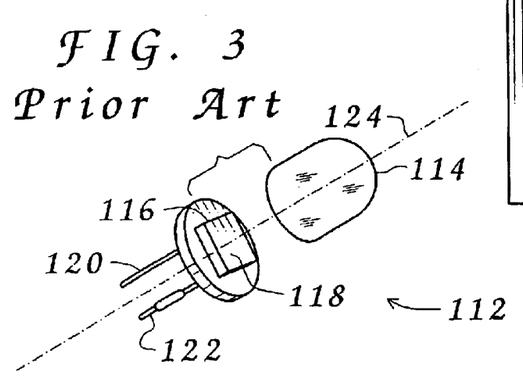
FIG. 3 is a perspective view of a light emitting diode chip with a molded protective cover partially removed therefrom and labeled as 'Prior Art'.

Light emitting diode chips employed for usage with the present invention may be of many different sizes and shapes. Many conventionally known light emitting diode chips may be utilized with the present invention. Any additional components required to enjoy full function of those specific designs, as conventionally known in the art, may be employed as needed. Referring now to FIG. 3, a light emitting diode emitter 112, as conventionally known in the art, is depicted having a protective cover 114 which is transparent and molded in place to encase a light emitting diode chip 116 during the manufacturing process and shown removably displaced in this view. Light emitting diode emitter 112 has light emitting diode chip 116 having a light producing surface 118 positioned thereon which produces a light when power flows through light emitting diode emitter 112 from a first power coupling 120 to a second power coupling 122. Light producing surface 118 has a central axis 124 extending therethrough. In the embodiment depicted, the light extends outward from light producing surface 118, in a slightly expanding pattern, and generally aligned with central axis 124.

Figure 4:
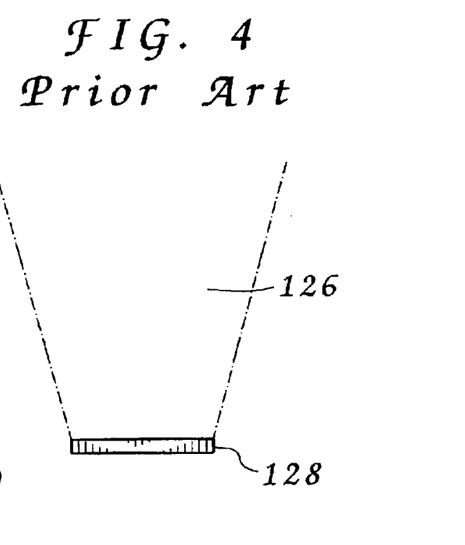
FIG. 4 is an elevational side view of a light emitting diode chip with a depiction of a projection of produced light and labeled as 'Prior Art'.

FIG. 4 depicts a projection of produced light 126 as may be produced by a light emitting diode chip 128, as conventionally known in the art. In this example produced light expands outward at about thirty (30) degrees.

Figure 12:
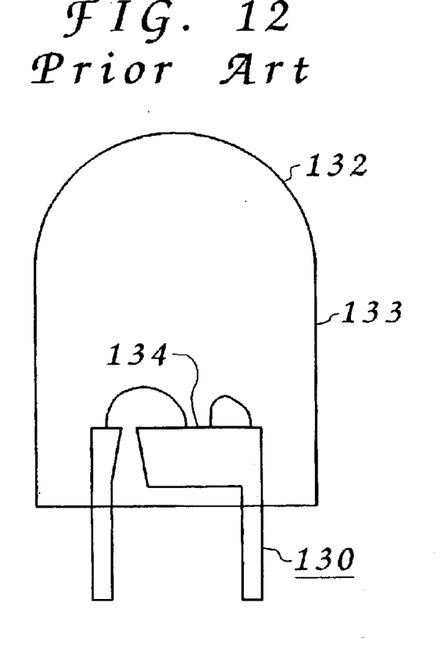
FIG. 12 is a plan view of a representation of a conventional light emitting diode emitter and labeled as 'Prior Art'.

FIG. 12 depicts a light emitting diode emitter 130, as conventionally known in the art, having a protective cover 132 positioned thereover, also as conventionally known in the art. Protective cover 132 has an exterior surface 133. Light emitting diode emitter 130 has a light emitting diode chip 134 encased in protective cover 132. Light emitting diode chip 134 produces light when power passes therethrough. Such common types of light emitting diode emitters as 130 typically produce light at a fairly narrow angle of projection. Light emitting diode chip 134 is capable of being manufactured to produce various colors of light as exampled by blue, red and green but also including white light.

Figures 6, 7:
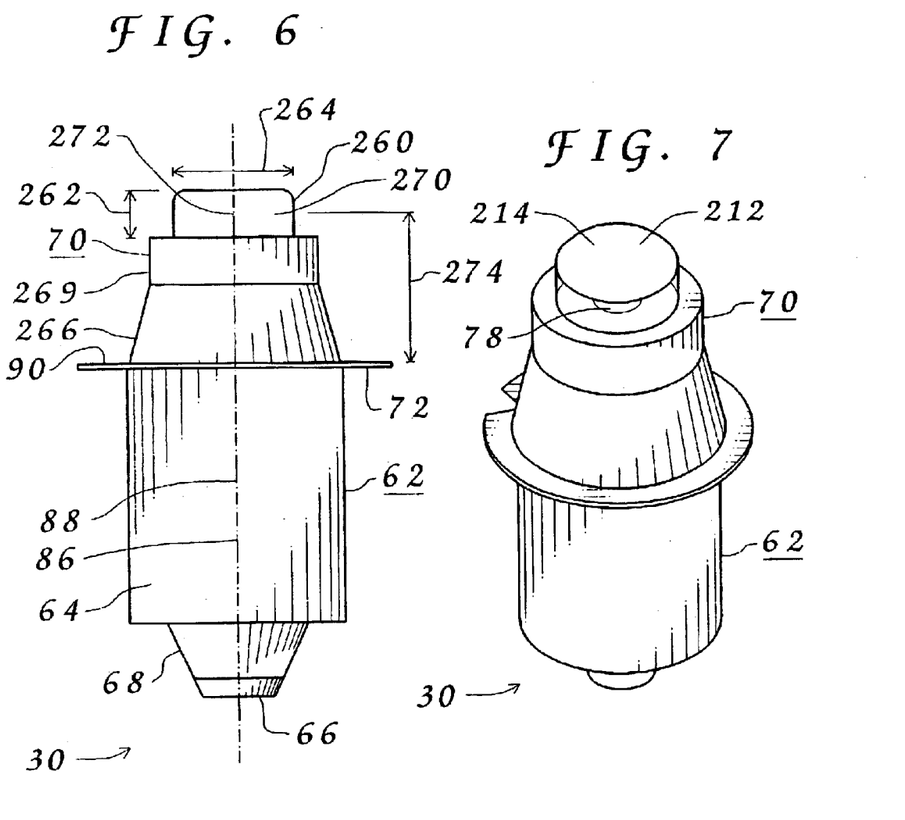
FIG. 6 is a plan view of the lamp shown in FIG. 1.
FIG. 7 is a perspective view of the lamp shown in FIG. 6.

FIG. 6 and FIG. 7 depict a protective cover 260 having a height 262 and a diameter 264, see FIG. 6. It being noted that diameter 264 is greater than height 262 and in this embodiment diameter 264 is more than twice height 262.

Dispersion Means

Dispersion means and distribution means each refer to redirecting light from an initial path of projection to cause the light to move off in different or various directions so as to be distributed widely about an axis of initial projection. The distribution of light accomplished by the present invention may be performed by many structures. Examples of such structures including those which rely upon refraction, reflection, diffusion or a combination thereof.

A dispersion method will act to expand an angle of projection of light produced by the light emitting diode chip beyond the initial angle of projection. A single dispersion method may be deployed or a plurality of dispersion methods may be deployed for a specific embodiment of lamp. The dispersion method preferably will be incorporated into the protective cover which encases and protects the light emitting diode chip. Alternatively, the structure which provides for the dispersion of produced light may contact the protective cover or may be spaced from the protective cover.

On any embodiment of the protective cover it is possible to provide for a combination of indices of refraction, selective reflective coatings, scarification, other surface texturing, light baffles or any combination thereof. The surface texturing, the indices of refraction, the reflective coatings and the light baffles may be positioned on, or beneath, exterior surfaces where the light moves about within the protective cover following interaction with the dispersion structures. The reflective coatings may be arranged to further disperse the light reflecting therefrom by lengthening the path of the light within the protective cover and also be employed to ensure that the produced light only exit from desired locations on the protective cover.

1) Refraction

Refraction refers to a bending of light as it passes obliquely, neither perpendicular nor parallel, from one medium to another of different density. A molded lens cover, preferably of plastic or glass, with molded in dispersion properties, such as indices of refraction, will effectively broaden the angle of light dispersion so that it reaches the walls of the collimating reflector of the flashlight. Such molded lens covers having dispersion properties also acts to mix more thoroughly the spectral colors produced by conventional white light emitting diode chips to significantly reduce blue tint bleed through and produce a truer white light. Therefore, by providing dispersion properties to the molded lens covers of conventional white light emitting diode chips we are able to both disperse the light to a greater angle of projection and produce a truer white light having few, if any, visible blue characteristics throughout the projection area.

A dispersion cover, or protective cover, is positioned symmetrically over the light emitting diode chip and is generally aligned with the axis of projection. The dispersion cover may have various shapes and orientations. The dispersion cover will provide for a radial distribution of at least a portion of the light produced by the light emitting diode chip radially outward from the axis of projection of the light emitting diode chip. The dispersion cover produces a lighted area having an average center of radiation when the light emitting diode chip is producing light. The dispersion cover may rely upon a reflection of the produced light to limit exit of that produced light to desired areas of the dispersion cover as more fully disclosed elsewhere herein.

Optical lens, of either molded plastic or ground glass, have an entry optic surface and an exit optic surface. These optic surface(s) are angled to create an angle of incidence which directs and changes the direction of radiated light emitting from the light emitting diode chip following passage therethrough. This provides for the emitted light to leave the optical lens through the exit optic surface at any predetermined angle up to about two hundred and eighty (280) degrees. This provides for the light emitting diode light source to work with flashlight collimating reflectors. The entry optic surface of the optical lens can be in direct contact with the light producing surface of the light emitting diode chip, as would exist when the protective cover is an optical lens, or may be spaced from the light producing surface of the light emitting diode chip.

A molded wave guide angle enhancer may be attached to the light emitting diode, or positioned therebefore, to provide for a distribution of the produced light to a broad distribution. This broad distribution provides for precise 'light center length' which matches a collimating reflector's focal point. The molded wave guide angle enhancer may have linear surfaces thereon, may have curved surfaces thereon or may be circular shaped. In any of the designs at least one light emitting diode chip is positioned to project the produced light into the enhancer for distribution therein for eventual discharge over a broad distribution range. The molded wave guide angle enhancer lens may, if desired, be incorporated into the protective container used to protect the light emitting diode, or diodes. It is possible to provide for the protective cover to be the molded wave guide angle enhancer.

The molded wave guide angle enhancer may have reflectorized wave guides positioned therein to provide for broadening the narrow polar distribution of the light emitting diode device to match a collimating reflector's focal point. Refraction angles are molded into the plastic lens cover where the refraction angles redirect the light to the side walls of the conventional collimating reflector wherein the collimating reflector can operate to collimate the light into the desired beam of light.

Such redirection of light may also be performed utilizing fiber optic conduit, of various designs, which may be utilized to distribute the light produced by the light emitting diode to match the collimating reflector's focal point.

Figure 18:
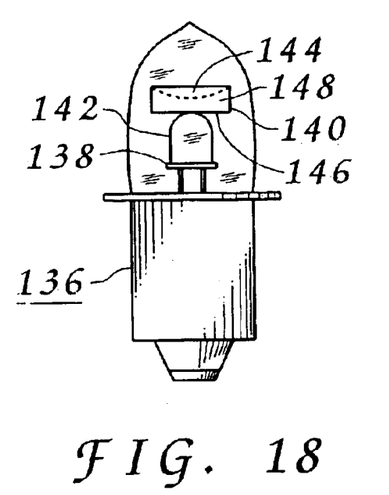
FIG. 18 is an elevational side view of a bulb assembly.

FIG. 18 depicts a bulb assembly 136 having a light emitting diode 138 positioned therein. A lens element 140 is depicted attached to a protective cover 142 of light emitting diode 138. Lens element 140 has a concave depression 144 positioned distal from light emitting diode 138. Lens element 140 has a receiving side 146 and a dispersing side 148 which is radially disposed. Lens element 140 acts to redirect the light produced by light emitting diode 138.

Figure 19:
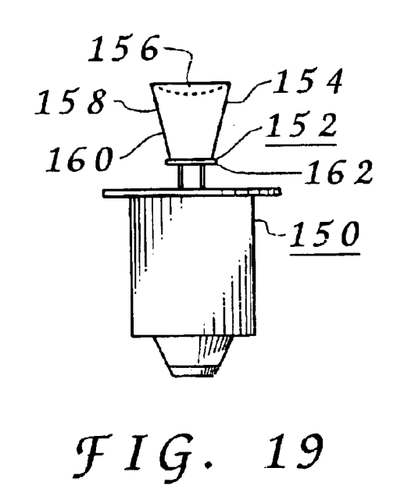
FIG. 19 is an elevational side view of a bulb assembly.

FIG. 19 depicts a lamp 150 based upon the general principles of bulb assembly 136 shown in FIG. 18. In this embodiment a light emitting diode emitter 152 has a protective cover 154 which has a depression 156 generally matching that of concave depression 144 shown in FIG. 18. Rather than being a separate lens element attached to the protective cover in this embodiment protective cover 154 is a lens element 158 capable of radially distributing light produced by light emitting diode emitter 152 based upon principles of refraction. Lens element 158 has a radially disposed dispersing side 160 incorporated thereon during the manufacturing process. Radially disposed dispersing side 160 tapers outward during travel away from a base 162 of light emitting diode emitter 152. Of course depression 156 may have any shape desired to enhance refraction of produced light where such produced light exits light emitting diode emitter 152 through radially disposed dispersing side 160.

Figure 20:
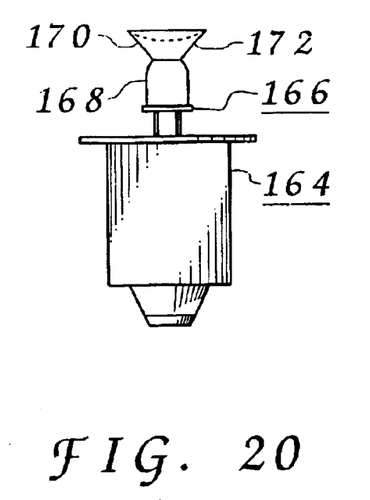
FIG. 20 is an elevational side view of a bulb assembly.

FIG. 20 depicts a lamp 164 also based upon the general principles of bulb assembly 136 shown in FIG. 18. In this embodiment a light emitting diode emitter 166 is comprised of a protective cover 168 and a lens element 170 mounted thereon. Protective cover 168 has a shape as conventionally known in the art for protective covers for light emitting diodes. Lens element 170 has a radially disposed dispersing side 172 which is angularly offset. Light produced by a light emitting diode chip, not shown in this view, passes through protective cover 168 and enters lens element 170 where refraction causes such light to be radially distributed where at least a portion of the produced light exits through radially disposed dispersing side 172.

Figure 22:
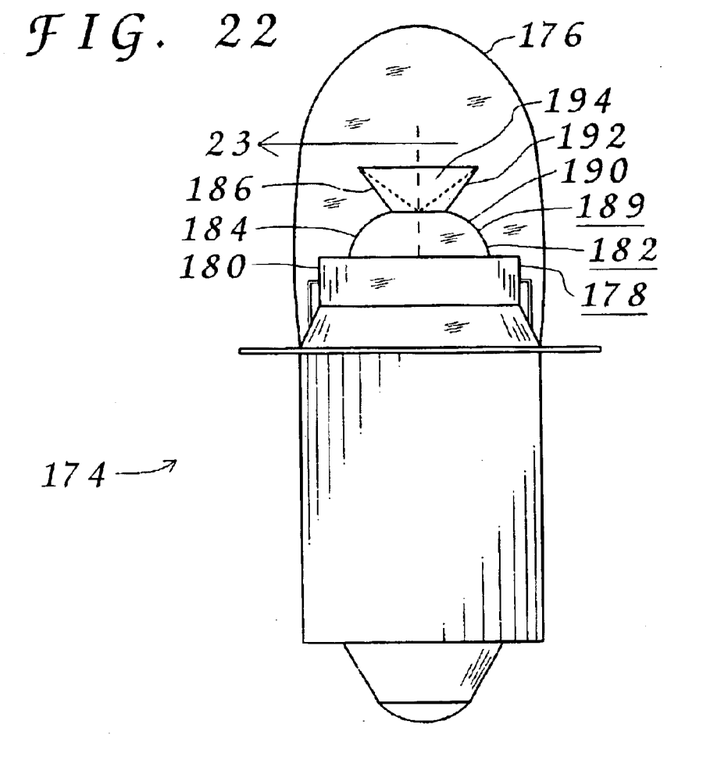
FIG. 22 is an elevational side view of a bulb assembly.
Figure 23:
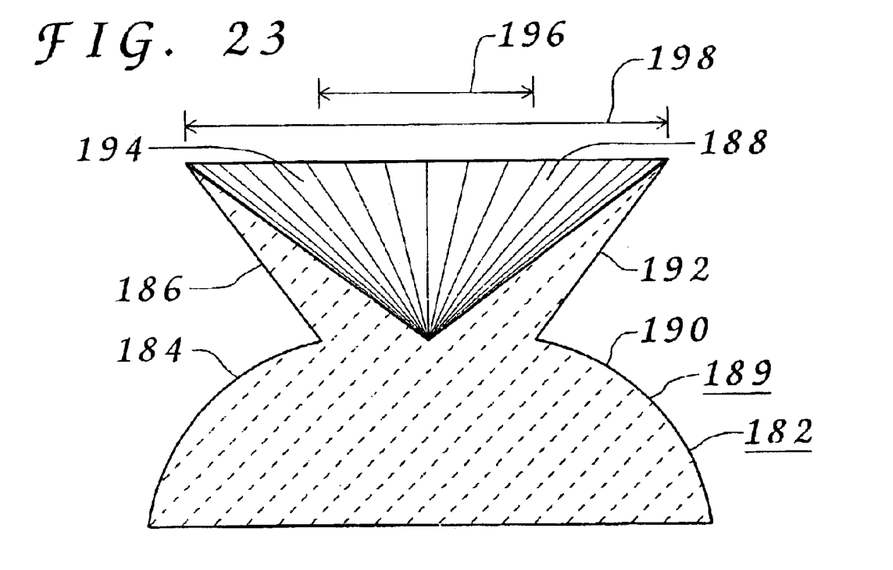
FIG. 23 is a sectional view of a protective cover as shown in FIG. 22 and taken from the section line '23'.

FIG. 22 depicts a lamp 174 also based upon the general principles of bulb assembly 136 shown in FIG. 18. Preferably a transparent envelope 176 will protect select components of lamp 174 from damage. In this embodiment a light emitting diode emitter 178 has a mounting board 180 having a light emitting diode chip, not shown in this view, and a protective cover 182. Protective cover 182, also see FIG. 23, is a single transparent element formed during a manufacturing process and having encased therein the light emitting diode chip. Protective cover 182 is an optical lens having exterior surface areas 184, 186 and 188. Exterior surface areas 184, 186 and 188 cooperate to provide for a compound exterior surface area 189. The term compound exterior surface area refers to an exterior surface having at least two radically different shapes and/or orientations which are easily defined from one another. Protective cover 182 has a first portion 190 adjacent mounting board 180 and a second portion 192 distal from mounting board 180. Exterior surface area 184 forms the entire exterior of first portion 190. Exterior surface area 186 forms a portion of second portion 192. Exterior surface area 188 forms a portion of second portion 192 and defines a depression 194. As more fully disclosed elsewhere herein a reflective coating may be applied to exterior surface area 188 and/or exterior surface area 184 to restrict where light may exit protective cover 182, which is a lens element. Protective cover 182 relies upon principles of refraction to radially distribute light produced by light emitting diode emitter 178 radially outward to produce a lighted area. Second portion 192 has a first diameter 196 adjacent first portion 190 and a second diameter 198 distal from first portion 190, see FIG. 23. In this preferred embodiment second diameter 198 is significantly greater than first diameter 196 wherein second portion 192 of protective cover 182 broadens as it extends away from first portion 190 of protective cover 182.

Figure 21:
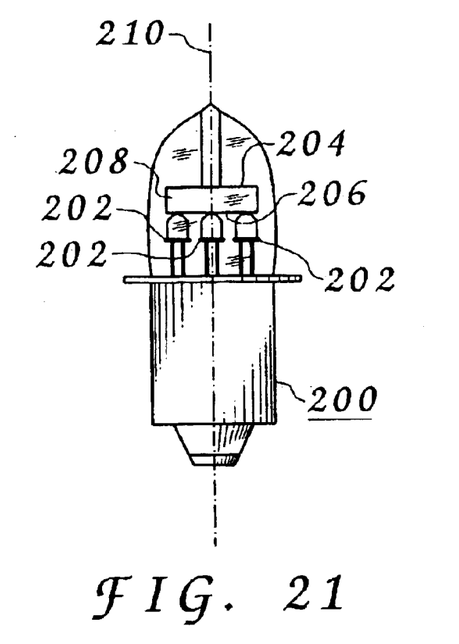
FIG. 21 is an elevational side view of a bulb assembly.

FIG. 21 depicts a bulb assembly 200 having three (3) light emitting diodes 202 positioned therein in a linearly aligned pattern. A molded wave guide angle enhancer 204 has a receiving side 206 and a dispersing side 208. Dispersing side 208 is a radially disposed wall extending three hundred and sixty (360) degrees about a central axis 210.

2) Reflection

A reflection of at least a portion of light produced by the light emitting diode chip may be utilized to provide for distribution of produced light to desired areas about the lamp. Various structural elements may be deployed to provide for this reflection of produced light. A simple coating of an exterior surface may be utilized to provide the desired reflection. Alternatively a structural element may be utilized to provide the desired reflection. Such reflection may be mere reflection or may include structural configuration of the reflective surface which disperse the light from a true reflective path. The structure which provides for reflection of produced light may be a coating applied to an exterior surface of the protective cover, may be contained within the protective cover of the light emitting diode emitter, may be in contact with an exterior of the protective cover of the light emitting diode emitter or may be spaced from the protective cover of the light emitting diode emitter.

In a preferred embodiment a reflective coating is applied to the exterior of the protective cover of the light emitting diode emitter in the path of projection of the produced light. This provides for the light to be redirected to exit the protective cover of the light emitting diode emitter only from exterior surfaces about the periphery of the protective cover of the light emitting diode emitter.

FIG. 7 depicts a reflective coating 212 applied to a top surface 214 of light emitting diode emitter 70. If desired such reflective coating may be applied to any protective cover any lens elements applicable to the present invention including depression 194 of protective cover 182 shown in FIG. 22 and FIG. 23.

Figure 14:
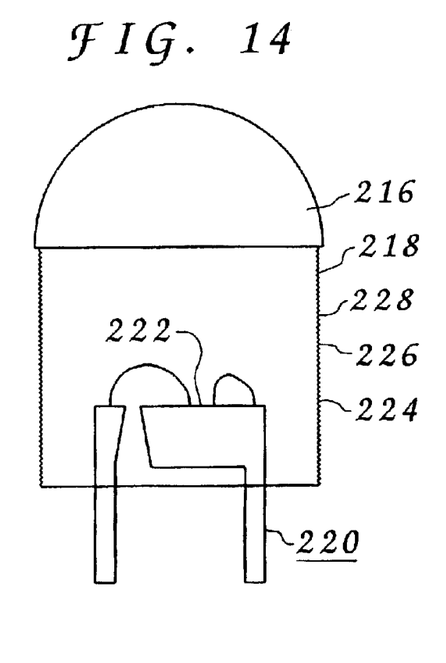
FIG. 14 is a plan view of the representation of the light emitting diode emitter shown in FIG. 13 with a representation of an exterior reflector installed thereon.

FIG. 14 depicts a reflective member 216 positioned over a protective cover 218 of a light emitting diode emitter 220 and in the path of projection of a light emitting diode chip 222. Therefore, produced light may only exit light emitting diode emitter 220 from a radially disposed side 224 of protective cover 218 which has a scarification 226 of an exterior surface 228.

Figure 15:
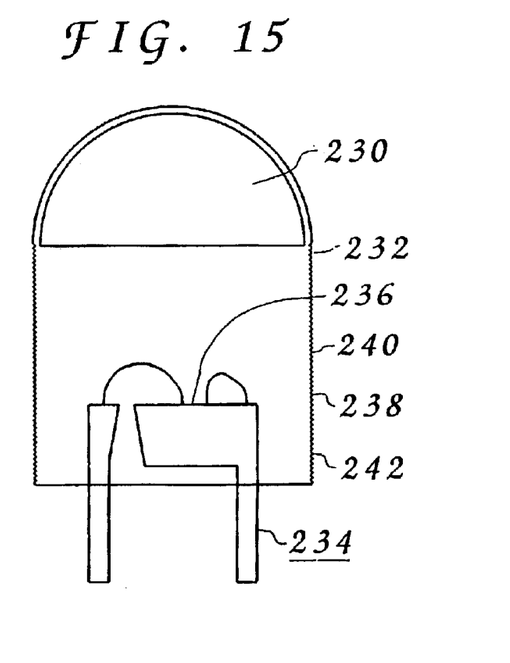
FIG. 15 is a plan view of a representation of a light emitting diode having a representation of an internal reflector incorporated therein along with a representation of surface texturing applied to the light emitting diode emitter.

FIG. 15 depicts a reflective member 230 positioned within a protective cover 232 as would result from placement during a manufacturing process of a light emitting diode emitter 234 and in the path of projection of a light emitting diode chip 236. Therefore, produced light may only exit light emitting diode emitter 234 from a radially disposed side 238 of protective cover 232 which has a scarification 240 of an exterior surface 242.

3) Diffusion

The dispersion method may involve diffusion of produced light. This diffusion may involve passing the light through a surface having a texturing or faceting thereon or passing the light through a translucent material or may involve reflection against a surface having a texturing or faceting thereon. A scarification of the exterior of the protective cover may be employed to provide for the desired dispersion of light produced by the light emitting diode chip contained within the protective cover. Various methods may be employed to provide for this scarification of the exterior of the protective cover. Examples of such methods include grinding, cutting, sand blasting, chemical treatment and molding.

Figure 8:
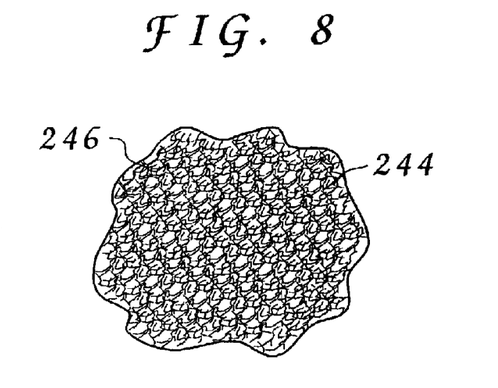
FIG. 8 is a cutaway view of a representation of a surface texturing of an exterior of a protective cover.

FIG. 8 depicts one example of a surface texturing 244 on a small portion of a protective cover 246. When protective cover 246 is transparent or translucent such surface texturing 244 disperses and scatters light passing through protective cover 246.

Figure 9:
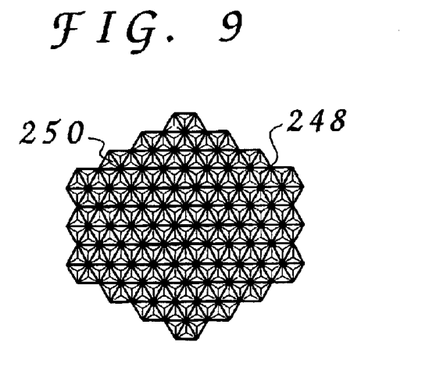
FIG. 9 is a cutaway view of a representation of a surface faceting of an exterior of a protective cover.

FIG. 9 depicts one example of a surface faceting 248 on a small portion of a protective cover 250. When protective cover 250 is transparent or translucent such surface faceting 248 disperses and scatters light passing through protective cover 250.

Figure 13:
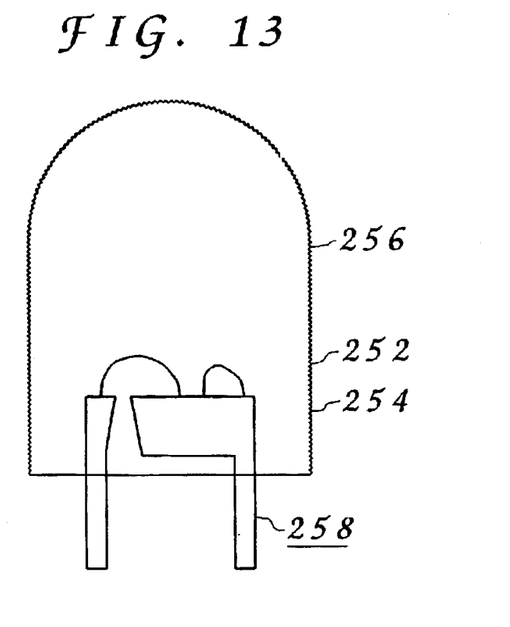
FIG. 13 is a plan view of a representation of surface texturing applied to the representation of the light emitting diode emitter shown in FIG. 12.

FIG. 13 depicts a scarification 252 of an exterior surface 254 of a protective cover 256 of a light emitting diode emitter 258. It being understood that such scarification would radially extend around exterior surface 254 of protective cover 256. Such scarification would disperse and scatter light produced by light emitting diode emitter 258. Such scarification could be performed by any conventionally known method of scarification of a surface.

Placement Means

Lamps having features of the present invention will have a lighted area subsequent to production of the light. This lighted area typically will match a shape and placement of a portion of an exterior of a dispersion unit acting upon the produced light. The lighted area will be placed on the lamp so as to result in a matching, or near matching, of placement of a light center length, LCL, of a compatible conventional incandescent lamp. The lighted area will have an average center of radiation with this average center of radiation placed on the lamp at a relative spacing from the lamp registering plane of the base and on the center axis of the base. The lighted area preferably will be at least a portion of an exterior of the protective cover, or dispersion cover, of the light emitting diode emitter.

Various structural arrangements may provide for this placement of the lighted area at the desired spacing from the lamp registering plane. Preferably such structural elements will provide for a protection of the overall integrity of the lamp while ensuring that the desired placement or spacing is maintained. Most preferably a filler material will seal the interior of the base of the lamp about the flange of the lamp and extend outward to surround the light emitting diode emitter. This provides for a protection of the structural elements contained within the base while also protecting the connections extending from the base to the light emitting diode emitter.

FIG. 6 and FIG. 7 depict lamp 30 having a filler material 266 completely sealing an interior 268, see FIG. 17, of base 62 about flange 72 and extending outward and upward from base 62 to radially surround a housing 269 of light emitting diode emitter 70. Protective cover 260 of light emitting diode emitter 70 has a lighted area 270 about protective cover 260 which has an average center of radiation 272. Average center of radiation 272 lies on center axis 86 and on 'y' axis 88 of three dimensional coordinate grid of base 62. Average center of radiation 272 has a spacing 274 from lamp registering plane 90. Spacing 274 preferably is between four millimeters and eight millimeters. Spacing 274 more preferably is between five and one half millimeters and seven millimeters. Spacing 274 is most preferably six and thirty-five hundredth millimeters.

With respect to the above description then, it is to be realized that the optimum dimensional relationships for the parts of the invention, to include variations in size, material, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A lamp for installation in a flashlight having a collimating reflector, the collimating reflector of the flashlight having a cavity, an aperture, a central axis, a focal point and a reflector registering plane, the aperture positioned at a symmetrically located position at one end of the cavity, the central axis extending through a center point of the aperture and extending through the cavity wherein the cavity is symmetrically positioned about the central axis, the focal point situated within the cavity at a predetermined spacing from the reflector registering plane and on the central axis, the lamp comprising:

a) a base having a center axis extending therethrough, the base having a flange having a lamp registering plane, the lamp registering plane positioned wherein the center axis of the base perpendicularly intersects the lamp registering plane, wherein the base is positioned relative to the aperture of the collimating reflector of the flashlight during the installation of the lamp in the flashlight wherein the center axis of the base aligns with the central axis of the collimating reflector subsequent to the installation;

b) a light emitting diode emitter having at least one light emitting diode chip, the light emitting diode emitter to produce a light;

c) distribution means to provide for a radial distribution at least a portion of the light produced by the light emitting diode emitter radially outward and wherein the distribution means provides for the light emitting diode emitter to produce a lighted area having an average center of radiation when the light emitting diode emitter is producing light;

d) placement means for a placement of the average center of radiation of the lighted area of the light emitting diode emitter relative to the base at a relative spacing from the lamp registering plane and on the center axis of the base.

2. The lamp defined in claim 1 wherein the light emitting diode emitter further comprises a protective cover encasing the light emitting diode chip, the protective cover having an exterior surface having a depression thereon, the depression positioned in the path of light produced by the light emitting diode chip.

3. The lamp defined in claim 1 wherein the relative spacing has a measurement of between five and one half millimeters and seven millimeters.

4. The lamp defined in claim 1 wherein the relative spacing has a measurement of six and thirty-five hundredth millimeters.

5. The lamp defined in claim 1 further comprising reflection means to provide for a redirection of a portion of the light produced by the light emitting diode chip.

6. The lamp defined in claim 1 wherein the light emitting diode emitter further comprises a protective cover encasing the light emitting diode chip, the protective cover having optical properties and being symmetrically shaped about a central axis, the protective cover having a first portion and a second portion, the light emitting diode chip encased in the first portion of the protective cover, the second portion extending above the first portion distal from the light emitting diode chip, the second portion have a first diameter adjacent the first portion and a second diameter distal from the first portion and wherein the second diameter is significantly greater than the first diameter wherein the second portion of the protective cover broadens as it extends away from the first portion of the protective cover.

7. The lamp defined in claim 1 wherein the distribution means further comprises a dispersion cover protecting the light emitting diode chip, the dispersion cover having an exterior surface and wherein the distribution means further comprises a scarification of the exterior surface of the dispersion cover, and wherein the scarification of the exterior surface of the dispersion cover scatters at least the portion of the light produced by the light emitting diode chip.

8. A lamp for installation in a flashlight having a collimating reflector, the collimating reflector of the flashlight having a cavity, an aperture, a central axis, a focal point and a reflector registering plane, the aperture positioned at a symmetrically located position at one end of the cavity, the central axis extending through a center point of the aperture and extending through the cavity wherein the cavity is symmetrically positioned about the central axis, the focal point situated within the cavity at a predetermined spacing from the reflector registering plane and on the central axis, the lamp comprising:

a) a base having a center axis extending therethrough, the base having a lamp registering plane positioned wherein the center axis of the base perpendicularly intersects the lamp registering plane, the base positioned relative to the aperture of the collimating reflector of the flashlight during the installation of the lamp in the flashlight wherein the center axis of the base aligns with the central axis of the collimating reflector subsequent to the installation and wherein the lamp registering plane of the base aligns with the reflector registering plane of the reflector of the flashlight subsequent to the installation;

b) a light emitting diode chip having a light producing surface, the light producing surface to produce light and having an axis of projection of the produced light;

c) a dispersion cover positioned symmetrically over the light emitting diode chip and generally aligned with the axis of projection of the light producing surface, the dispersion cover to provide for a radial distribution of at least a portion of the light produced by the light emitting diode chip radially outward from the axis of projection of the light emitting diode chip, the dispersion cover producing a lighted area having an average center of radiation when the light emitting diode emitter is producing light;

d) placement means for a placement of the average center of radiation of the lighted area of the dispersion cover relative to the base at a relative spacing from the lamp registering plane of the base and on the center axis of the base wherein the average center of radiation of the lighted area of the dispersion cover generally matches the focal point of the collimating reflector of the flashlight following the installation of the lamp within the flashlight.

9. The lamp defined in claim 8 wherein the dispersion cover is attached to a protective cover, the protective cover having the light emitting diode chip encased therein.

10. The lamp defined in claim 8 wherein the dispersion cover is transparent.

11. The lamp defined in claim 8 wherein the dispersion cover is a protective cover having the light emitting diode chip encased therein.

12. The lamp defined in claim 11 wherein the dispersion cover further comprises a compound exterior surface area and refraction means associated with the exterior surface areas to provide for the radial distribution of the portion of the light produced by the light emitting diode chip.

13. The lamp defined in claim 8 wherein the dispersion cover further comprises reflection means to provide for a redirection of a portion of light produced by the light emitting diode chip.

14. The lamp defined in claim 8 wherein the dispersion cover further has a height measured along the center axis of the base and a diameter measured perpendicular to the center axis of the base and wherein the diameter of the dispersion cover is greater than the height of the dispersion cover.

15. The lamp defined in claim 8 wherein the dispersion cover further has an exterior surface and a scarification of the exterior surface, the scarification of the exterior surface of the dispersion cover providing for at least a portion of the radial distribution of at least the portion of the light produced by the light emitting diode chip.

16. A lamp for installation in a flashlight having a collimating reflector, the collimating reflector of the flashlight having a cavity, an aperture, a central axis, a focal point and a reflector registering plane, the aperture positioned at a symmetrically located position at one end of the cavity, the central axis extending through a center point of the aperture and extending through the cavity wherein the cavity is symmetrically positioned about the central axis, the focal point situated within the cavity at a predetermined spacing from the reflector registering plane and on the central axis, the lamp comprising:

a) a base having a center axis extending therethrough, the base having a lamp registering plane positioned wherein the center axis of the base perpendicularly intersects the lamp registering plane, the base positioned relative to the aperture of the collimating reflector of the flashlight during the installation of the lamp in the flashlight wherein the center axis of the base aligns with the central axis of the collimating reflector subsequent to the installation;

b) a light emitting diode chip to produce a light;

c) dispersion means to provide for a radial distribution of at least a portion of the light produced by the light emitting diode chip radially outward, the dispersion means relying at least in part upon refraction to provide for production of a lighted area having an average center of radiation when the light emitting diode emitter is producing light;

d) placement means for a placement of the average center of radiation of the lighted area relative to the base at a relative spacing from the lamp registering plane of the base and on the center axis of the base wherein the average center of radiation of the lighted area generally matches the focal point of the collimating reflector following installation of the lamp within the flashlight.

17. The lamp defined in claim 16 further comprising reflection means to provide for a redirection of at least a portion of the light produced by the light emitting diode.

18. The lamp defined in claim 17 wherein the dispersion means further comprises a protective cover encasing the light emitting diode chip and wherein the reflection means further comprises a coating applied to an exterior surface of the protective cover.

19. The lamp defined in claim 16 wherein the dispersion means further comprises a protective cover encasing the light emitting diode chip, the protective cover having a compound exterior surface area wherein the protective cover acts as an optical lens.

* * * * *